United States Patent [19]

Fleming et al.

[11] 4,407,860

[45] Oct. 4, 1983

[54] PROCESS FOR PRODUCING AN IMPROVED QUALITY ELECTROLESSLY DEPOSITED NICKEL LAYER

[75] Inventors: Rebecca P. Fleming, Fairfax, Va.; Samuel Lawhorne, Jr., Poughkeepsie, N.Y.; John J. Mele, Cornwall-on-Hudson, N.Y.; Chandrika Prasad, Poughkeepsie, N.Y.

[73] Assignee: International Business Machines Corporation, Armonk, N.Y.

[21] Appl. No.: 278,945

[22] Filed: Jun. 30, 1981

[51] Int. Cl.³ .............................................. B05D 5/12
[52] U.S. Cl. ...................................... 427/98; 427/96; 427/123; 427/126.2; 427/305; 427/376.3; 427/383.3; 427/383.5; 427/404; 427/419.2
[58] Field of Search ............. 427/92, 98, 376.7, 383.1, 427/383.3, 383.5, 305, 438, 443.1, 123, 126.2, 376.3, 404, 419.2

[56] References Cited

U.S. PATENT DOCUMENTS

| | | | |
|---|---|---|---|
| 3,539,391 | 11/1970 | Lepiane | 427/98 |
| 3,579,375 | 5/1971 | Wonilowicz | 427/92 |
| 3,632,436 | 1/1972 | Denning | 427/92 |
| 3,962,143 | 6/1976 | Hitch et al. | 252/514 |
| 4,055,706 | 10/1977 | Galmiche et al. | 428/652 |
| 4,245,273 | 1/1981 | Feinberg et al. | 361/382 |
| 4,349,585 | 9/1982 | Nagashima | 427/125 |

FOREIGN PATENT DOCUMENTS

| | | | |
|---|---|---|---|
| 48-61976 | 6/1973 | Japan | 427/92 |
| 55-34692 | 3/1980 | Japan | 427/92 |

OTHER PUBLICATIONS

Stelmak, IBM Tech. Dis. Bul., vol. 20, No. 7, Dec. 1977.
Haddad, IBM TDB, vol. 16, No. 4, Sep. 1973, p. 1282.
Haddad et al., IBM TDB, vol. 21, No. 6, Nov. 1978, p. 2316.
Harvilchuck et al., IBM TDB, vol. 19, No. 11, Apr. 1977, p. 4158.

*Primary Examiner*—Norman Morgenstern
*Assistant Examiner*—Richard Bueker
*Attorney, Agent, or Firm*—Wolmar J. Stoffel

[57] ABSTRACT

A method of providing a stress-free metal layer by electroless plating techniques, including the steps of (1) providing a substrate that includes some glass material in at least the surface areas to receive a metal layer, (2) depositing a layer of metal-boron by electroless plating techniques, and (3) heating the resultant metal-boron layer in a non-reacting and/or $H_2$ environment at a temperature of at least 750° C. for a time sufficient to diffuse the boron to the glass material in the substrate.

4 Claims, 3 Drawing Figures

PROCESS FOR PRODUCING AN IMPROVED QUALITY ELECTROLESSLY DEPOSITED NICKEL LAYER

TECHNICAL FIELD

This invention relates to a process for depositing nickel and related metals and alloys by auto catalytic chemical reduction, more particularly to depositing nickel layers by auto catalytic chemical reduction with amine boron compounds in the plating solution.

In the semiconductor fabrication technology, it is sometimes necessary to plate selected areas of a substrate with a conductor metal where evaporation through a mask or establishing of electrical contact to the conductive areas to be plated is not feasible or possible. In such instances, deposition of a conductive layer can be conveniently achieved by electroless plating techniques i.e., a process where a plating bath that contains ions of the metal to be deposited along with an auto catalytic chemical reducing agent for the metal ion deposits the metal in a layer by reducing the ions. Such baths generally contain either a hypophosphate, as described in U.S. Pat. No. 3,753,742, or an amine boron reducing agent as described in U.S. Pat. No. 2,990,296. The resulting deposited metal layers from electroless plating bath inherently contain byproducts of the auto catalytic reduction, i.e., phosphorous, or boron. These impurities cause stresses within the metal layers, and can also reduce the wettability of the surface, and thereby adversely affect subsequent brazing or soldering processes involving the deposited layer.

BACKGROUND ART

The prior art, U.S. Pat. No. 4,055,706 discloses a process for forming an oxidation resistance metallic coating by depositing a nickel boron layer on a substrate from an acqueous bath, and heating the nickel boron layer in a halogenated reducing atmosphere to a temperature in the range of 850° to 1300° C. to thereby eliminate the boron from the layer. IBM TDB Vol. 20 No. 7 December 1977 P. 2668 suggests eliminating phosphorous from a nickel-phosphorous layer deposited by electrodeposition techniques by heating.

DISCLOSURE OF INVENTION

In accordance with the present invention, we provide a process that results in a metal boron layer deposited by electroless plating techniques that is relatively uncontaminated with the usual by-products of the auto catalytic metal reduction reaction, i.e., boron. Thus, a selectively deposited metal layer can be produced by electroless plating techniques that has the purity of the layer deposited by electroplating techniques which require electrical contact to conductive areas to be plated. The advantages of electroless plating process are achieved without the usual attendant disadvantages.

Our process for providing an improved quality stress-free metal layer involves
 providing a substrate that includes some glass material at the surface area to receive the metal layer,
 depositing a layer of conductive metal and boron on the surface areas of the substrate by electroless plating techniques, and
 heating the resultant substrate and conductive metal and boron layer in a non-reactive and/or $H_2$ environment at temperatures of at least 750° C. for a time sufficient to diffuse the boron from the conductive layer to the glass in the substrate.

BRIEF DESCRIPTION OF DRAWINGS

The details of the invention will be described in connection with the accompanying drawings, in which.

BEST MODE FOR CARRYING OUT THE INVENTION

Figure 1:
FIG. 1 is a magnified cross section of an electroless nickel-boron layer deposited on a molybdenum-glass stripe.

It is important to an understanding of the nature of and the importance of the invention to relate present practices and problems in a typical application of conductive layers in the semiconductor technology, more specifically, the packaging technology. A semiconductor package has a relatively large substrate, as compared to an integrated circuit silicon semiconductor device, formed of an insulating material and provided with a conductive metallurgy system that interconnects devices mounted on the substrate and also spreads out the I/O terminals for connections to a larger board or card. As the semiconductor devices become more dense and the speed of operation increases, an urgent need arises to produce packaging structure that is capable of fully utilizing the performance capabilities of the semiconductor devices. It is advantageous to mount and interconnect many devices on a single substrate, and to fabricate the substrate so that the very rapid electrical signals are not dissipated by internal parasitic inductance and capacitive effects. A semiconductor package that is capable of achieving the objective is disclosed in U.S. Pat. No. 4,245,273 and has a multilayer ceramic substrate. The substrate is built up of a plurality of green ceramic sheets that have punched via holes and conductive patterns arranged to provide an internal interconnected metallurgy system. The metallurgy is normally a screened refractory metal capable of withstanding the high temperatures necessary for sintering the green ceramic substrate.

Following the sintering, the exposed sintered refractory metal patterns on the top and bottoms of the substrate must be made receptive to soldering or brazing. A known method is to provide a layer of solderable or brazable metal, i.e., copper or nickel to the surface of the screened and sintered refractory metal area. Since the green ceramic substrate may not shrink uniformly during sintering, the use of a mask to selectively deposit or substractively etch the solderable metal may not be feasible, particularly with large substrates with very fine metallurgy patterns. Also, electroplating may not be used if some of the areas cannot be directly connected to a source of current.

A solution is to electrolessly plate the refractory metal areas on the substrate with a solderable or brazable metal layer, typically nickel. However, the resultant metal layer contains byproducts of the auto catalytic reduction reaction which are detrimental because stresses in the layer are created which can cause separation of the layer, and the impurities in the layer can cause loss of wettability of the molten solder or braze material.

In this process an electroless nickel layer is deposited from a bath containing amine boron auto catalytic reduction agent on a surface containing glass material, and the resultant nickel boron layer heated to a temperature of at least 750° C. for a time sufficient to diffuse the boron from the nickel boron layer to the glass in the substrate. It is theorized that the boron is diffused inwardly, reacts with and is held by the glass leaving the nickel layer substantially free of contamination.

In the practice of our invention, the impurity free nickel layer can be deposited on any suitable substrate. If the nickel layer is to be selectively formed in a pattern, the pattern configuration must be defined either by an underlying metallurgy pattern, i.e., a screened pattern that normally includes a refractory metal, or by activation of the area with an agent known in the electroless plating technology. Electroless plating baths are available that selectively plate only screened metal areas. The areas to be plated must have glass particles adjacent to surface, normally in the range of 0.5 to 15% by weight. The most preferred base for deposition of an electroless nickel layer is a screened pattern formed of a particulate refractory metal such as tungsten, tantalum, molybdenum or manganese, an organic resin vehicle, and a glass frit in an amount in the range of 0.5 to 15%, more specifically in the range of 4 to 11% by weight. The pattern can be screened on a green ceramic substrate and sintered with the substrate or it can be screened and sintered on a ceramic substrate already sintered. Alternately, the screened metallic pattern can be formed of a paste that does not include glass frit. However, the substrate must contain glass which, during sintering, will migrate upwardly to infiltrate the refractory metal paste pattern in the necessary amount.

After the substrate has been properly prepared and cleaned, a layer of nickel-boron is deposited with any suitable plating bath that contains an amine-boron reducing agent and nickel ion. Suitable electroless plating baths are commercially available and are described generally in U.S. Pat. No. 2,990,296. When the proper bath is selected, the nickel-boron layer is deposited only on the underlying refractory metal areas. The nickel-boron layer will typically contain from 0.1 to 3% boron, more typically from 0.3 to 0.7% boron by weight. The thickness of the nickel-boron layer is normally in the range of 2 to 15 microns. FIG. 1 depicts a highly magnified cross section of a nickel-boron layer having approximately 1% boron overlying a screened molybdenum and glass layer. Note that the nickel boron layer 10A includes many dark spots which is indicative of boron particles. In the lower underlying screened molybdenum layer 12, the dark particles are glass particles and the lighter areas indicate molybdenum.

Figure 2:
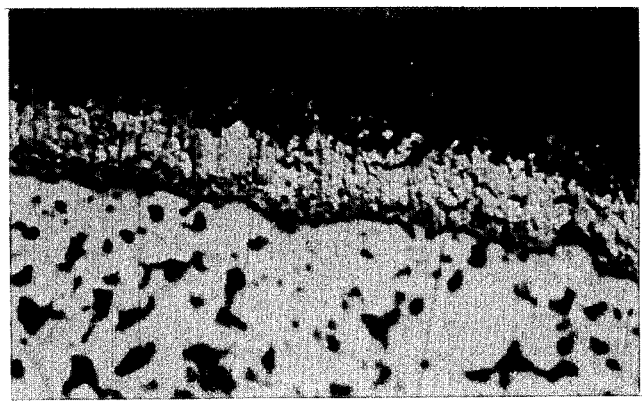
FIG. 2 is a magnified cross section of a similar composite layer shown in FIG. 1 taken at an intermediate stage of heat treatment in accordance with the process of our invention.
Figure 3:
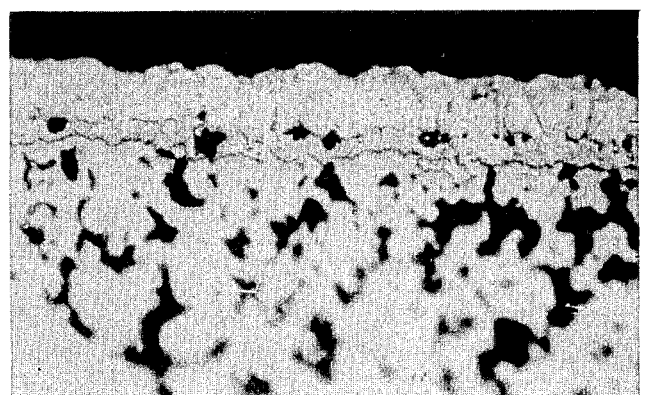
FIG. 3 is a magnified cross section of a composite electroless nickel molybdenum-glass stripe similar to that illustrated in FIG. 1 taken at the completion of the heat treatment in accordance with the process of the invention.

In the process of our invention, the resultant substrate and nickel boron layer is then heated in an inert environment at a temperature in the range of 750° to 1200° C., more preferably in the range of 800° to 900° C. The environment can be a non-reacting gas such as helium or argon, a reducing atmosphere that includes hydrogen or a combination of hydrogen and nitrogen, or a vacuum. The heating step is carried on for a time sufficient to cause the boron in the nickel-boron layer 10A to diffuse downwardly where it is theorized to react with and be held by the glass in underlying molybdenum layer 12. FIG. 3 depicts a nickel-boron layer 10B that has been heated for a time sufficient to drive the boron particles into the underlying molybdenum layer 12. Note that in lower layer 10B there is an absence of dark particles as compared to layer 10A which indicates that the boron has been removed. Referring now to FIG. 2 there is depicted a nickel-boron layer that has been heated an insufficient length of time to completely remove the boron. Note that the upper portion 10A is similar to the layer 10A in FIG. 1 wherein the lower portion 10B is lighter in color and compares to layer 10B in FIG. 3.

The following examples are included to indicate preferred specific embodiments of the process of our invention and are not intended to materially limit the scope of the claims.

EXAMPLE I

Two sets of green ceramic substrates were fabricated, with each substrate having an internal metallurgy system achieved by constructing the substrate using multilayer ceramic technology. On each substrate of the two sets of substrates a surface metallurgy system was deposited by screening a conductive paste mixture through an apertured mask. The paste was composed of Mo particles having a particle size range from 1 to 10 microns in amounts of 81% by weight, glass frit with particles having a particle size in the range of 1 to 10 microns in an amount of 4% by weight, and the remainder an organic vehicle. The surface metallurgy was composed of pads making contact with the internal metallurgy system and covered approximately 90% of the top surface area of each substrate. Both sets of substrates were subsequently sintered in a $H_2$ atmosphere in a furnace at a temperature of about 1500° C. for 6 hours. Examination of the top surfaces of the sintered pads indicated the presence of glass particles interspersed within the sintered Mo metal pads. The pads were approximately 25 microns thick. The pad surfaces of both sets of substrates were prepared for metal plating by vapor blasting, immersion in a KOH etch, immersion in $K_3F_2(CN)_6$ solution, and finally in a palladium chloride activation bath. The substrates were then immersed in a commercially available electroless Ni plating bath that included an amine borane reducing agent and a Ni salt. Electroless Ni plating baths suitable for use in the practice of this invention are described in U.S. Pat. No. 2,990,296 and U.S. Pat. No. 3,338,727. This process step resulted in a selective deposition of a nickel-boron layer with an average thickness of 5 microns and a boron content of 1%. The first set of substrates was placed in a furnace, heated to a temperature of 860° C. containing a wet $H_2$ atmosphere, and heated for 15 minutes. The second set of substrates was heated in the same furnace for the same time but at a temperature of 600° C. After the sets of substrates were allowed to cool, they were examined and analyzed. X-ray diffraction tests indicated that only a negligible amount of boron remained in the nickel layer in the first set of substrates, but the nickel layer in the second set of substrates contained about 1% boron. The stress in the nickel layer in both sets of substrates was measured. The stress in the nickel layers of the first set was approximately 10,000 psi while the stress in the nickel layers of the second set was approximately 100,000 psi. Thus it was concluded that the higher heat treatment applied to the first set of substrates produced a significantly superior nickel layer with no significant boron content and lower stressing.

EXAMPLE II

Two sets of green ceramic substrates were fabricated as was described in Example I. However, conductive paste used to produce the surface metallurgy did not contain glass frit, as in Example I, but did contain the same Mo particles and vehicle in the same proportions. The resultant sets of substrates were sintered as in Example I, nickel-boron layers deposited with the same bath to the same thicknesses. Again the first and second sets were heated as in Example I and the resultant nickel layers examined and analyzed. The boron content in the nickel layers of the first set was negligible, while it was approximately 1% in the second set. The stress in the nickel layer of the first set of substrates was also much lower than in the second set.

While the invention has been illustrated and described with reference to preferred embodiments thereof, it is to be understood that the invention is not limited to the precise construction herein disclosed and the right is reversed to all changes and modifications coming within the scope of the invention as defined in the appended claims.

We claim:

1. A process for providing a stress-free pure nickel layer on a ceramic substrate comprising
    screening on said ceramic substrate selected metallized surface areas formed of a particulate paste mixture that includes a refractory metal selected from the group consisting of Mo, Ta, W and Mn and mixtures thereof, and a particulate glass material in an amount in the range of 0.5 to 15% by weight, and sintering the surface areas,
    selectively depositing a layer of nickel-boron on said metallized surface areas of said substrate by electroless plating techniques, wherein said boron content is in the range of 0.1 to 3% by weight, and
    heating the resultant substrate and nickel-boron layer in a non-reacting environment at a temperature of at least 750° C. for a time sufficient to diffuse the boron from the nickel-boron layer to said glass in said metallized surface areas of the substrate, leaving essentially a pure stress-free nickel layer bonded to said substrate.

2. The process of claim 1 wherein said substrate is heated in a wet or dry hydrogen environment at atmospheric pressure to a temperature in the range of 800° to 900° C.

3. The process of claim 1 wherein said substrate is heated in an inert environment of a gas selected from the group consisting of argon, helium, nitrogen, and mixtures thereof to a temperature in the range of 750° to 1200° C.

4. The process of claim 1 wherein said surface layer areas have a thickness in the range of 5 to 50 microns.

* * * * *